United States Patent
Sharma et al.

(10) Patent No.: US 7,652,596 B1
(45) Date of Patent: *Jan. 26, 2010

(54) VARIABLE-LENGTH COMPRESSION TECHNIQUE FOR ENCODING OR DECODING A SEQUENCE OF INTEGERS

(75) Inventors: Arun Sharma, Union City, CA (US); Dean Gaudet, San Francisco, CA (US)

(73) Assignee: Google Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/346,672

(22) Filed: Dec. 30, 2008

Related U.S. Application Data

(63) Continuation-in-part of application No. 12/042,981, filed on Mar. 5, 2008.

(60) Provisional application No. 60/981,746, filed on Oct. 22, 2007.

(51) Int. Cl.
H03M 7/40 (2006.01)

(52) U.S. Cl. .............. 341/67; 341/56; 341/57; 341/59; 341/90; 341/106; 708/203; 708/207; 382/245; 382/251

(58) Field of Classification Search .......... 341/56, 341/57, 59, 67, 90, 106; 708/203, 207; 382/245–251
See application file for complete search history.

(56) References Cited

U.S. PATENT DOCUMENTS

| | | | | |
|---|---|---|---|---|
| 5,493,520 A * | 2/1996 | Schmookler et al. | ........ | 708/211 |
| 5,708,431 A * | 1/1998 | Howard | ........ | 341/107 |
| 5,798,953 A * | 8/1998 | Lozano | ........ | 708/211 |
| 6,005,503 A * | 12/1999 | Burrows | ........ | 341/67 |
| 6,173,300 B1 * | 1/2001 | Mahurin | ........ | 708/211 |
| 6,191,711 B1 * | 2/2001 | Smith | ........ | 341/84 |
| 6,195,743 B1 * | 2/2001 | Elnozahy | ........ | 712/42 |
| 6,633,242 B2 * | 10/2003 | Brown | ........ | 341/50 |
| 6,668,092 B1 * | 12/2003 | Sriram et al. | ........ | 382/244 |
| 6,757,820 B2 * | 6/2004 | Sudharsanan et al. | ........ | 712/300 |
| 2005/0134486 A1 * | 6/2005 | Lovell | ........ | 341/60 |
| 2008/0231483 A1 * | 9/2008 | He et al. | ........ | 341/107 |

OTHER PUBLICATIONS

U.S. Appl. No. 12/042,981.*

* cited by examiner

*Primary Examiner*—Linh V Nguyen
(74) *Attorney, Agent, or Firm*—Park, Vaughan & Fleming LLP

(57) ABSTRACT

The described embodiments provide a system that encodes a sequence of integers using a variable-length compression technique. During operation, the system scans the sequence of integers and observes the sizes of the integers to determine a threshold value, K, from the observed sizes. For a given integer of length N bits, if N−K is greater than zero, the system generates a tag for the encoded integer comprising a sequence of N−K zeros followed by a one, and generates a set of remaining bits for the encoded integer as a sequence of the N−1 least-significant bits which make up the integer. Otherwise, the system generates a tag for the encoded integer as a single one, and generates a set of remaining bits for the encoded integer by padding the N bits which make up the integer with zeros so that the set of remaining bits is K bits in length.

24 Claims, 4 Drawing Sheets

US 7,652,596 B1

VARIABLE-LENGTH COMPRESSION TECHNIQUE FOR ENCODING OR DECODING A SEQUENCE OF INTEGERS

RELATED APPLICATIONS

This application is a continuation-in-part of a pending U.S. parent patent application, entitled "VARIABLE-LENGTH COMPRESSION TECHNIQUE FOR ENCODING OR DECODING A SEQUENCE OF INTEGERS," by inventor Arun Sharma, having Ser. No. 12/042,981 and a filing date of 5 Mar. 2008. This application hereby claims priority under 35 U.S.C. § 120 to the above-listed pending patent application. This parent application claims priority to U.S. Provisional Patent Application No. 60/981,746 filed 22 Oct. 2007, entitled "VARIABLE-LENGTH COMPRESSION TECHNIQUE FOR ENCODING A SEQUENCE OF INTEGERS," by inventor Arun Sharma.

BACKGROUND

1. Field

The present embodiments relate to techniques for compressing data. More specifically, the present embodiments relate to a method and apparatus for encoding and decoding a sequence of integers based on a variable-length compression technique.

2. Related Art

The relentless growth of the Internet is making it increasingly hard for search engines to comb through the billions of web pages that are presently accessible through the Internet. Search engines typically operate by identifying web pages containing occurrences of specific terms (i.e., words) within these documents. For example, a search engine might search for all web pages containing the terms "military" and "industrial." A search engine can also search for web pages containing a specific phrase, such as "flash in the pan."

Search engines generally use an "inverted index" to facilitate searching for occurrences of terms. An inverted index is a lookup structure that specifies where a given term occurs in a set of documents. For example, an entry for a given term in the inverted index may contain identifiers for documents in which the term occurs, as well as offsets of the occurrences within the documents. This allows documents containing the given term to be rapidly identified.

For example, referring to FIG. 1, an exemplary search engine 112 operates by receiving a query 113 from a user 111 through a web browser 114. This query 113 specifies one or more terms to be searched for in the set of documents. In response to query 113, search engine 112 uses inverted index 110 to identify documents that satisfy the query. Search engine 112 then returns a response 115 through web browser 114, wherein the response 115 contains references to the identified documents.

Documents can also be stored in compressed form in a separate compressed repository 106. This allows documents, or portions of documents (snippets), to be easily retrieved by search engine 112 and to be displayed to user 111 through web browser 114.

As is illustrated in FIG. 1, web crawler 104 continually retrieves new documents from web 102. These new documents feed through a compressor 105, which compresses the new documents before they are stored in compressed repository 106. The new documents also feed through indexer 108, which adds terms from the new documents into inverted index 110. The inverted index 110 illustrated in FIG. 1 can be used to efficiently identify specific terms in documents.

Note that compressed repository 106 and inverted index 110 are comprised of sequences of integers. Moreover, it is desirable to store these integers in compressed form because the document corpus can potentially contain billions of web pages.

Various techniques can be used to compress these integers, such as compression techniques which use an Elias gamma code (referred to as a "gamma code"). A gamma code is a universal code which can be used to encode positive integers. To encode an integer using a gamma code, the integer is separated into the highest power of two it contains $2^N$, and the remaining N binary digits of the integer. The number N is encoded in unary (for example using a string of N zeros followed by a one) and this unary string is prepended to the remaining N binary digits. Hence, the number of zeros at the beginning of the encoded number indicates the number of bits which follow the one in the remaining binary number. (For example, see http://en.wikipedia.org/wiki/Elias_gamma_coding.)

Although a gamma code can be efficient in some applications, the gamma code effectively uses twice the number of bits as is necessary to represent a number. Hence, the gamma code generally does not compress a sequence of integers as efficiently as possible.

SUMMARY

The described embodiments provide a system that encodes a sequence of integers using a variable-length compression technique. During operation, the system scans the sequence of integers and observes the sizes of the integers to determine a threshold value K from the observed sizes. For a given integer which is N bits in length, if N−K is greater than zero, the system generates a tag for the encoded integer which comprises a sequence of N−K zeros followed by a one, and generates a set of remaining bits for the encoded integer as a sequence of the N−1 least-significant bits which make up the integer. Otherwise, if N−K is less than or equal to zero, the system generates a tag for the encoded integer as a single one, and generates a set of remaining bits for the encoded integer by padding the N bits which make up the integer with zeros so that the set of remaining bits is K bits in length.

In a variation on this embodiment, for a given integer to be encoded, the system prepends the tag to the remaining bits to produce the encoded integer.

In a variation on this embodiment, the system stores all tags generated for the sequence of integers in a first stream, and stores all remaining bits generated for the sequence of integers in a corresponding second stream, wherein the ordering of the tags in the first stream is the same as the ordering of the corresponding remaining bits in the second stream.

In a variation on this embodiment, the system combines the tags and the remaining bits generated for the sequence of integers into a single data stream, wherein a tag generated for a given integer is prepended to the corresponding remaining bits for the given integer.

In a variation on this embodiment, the system determines the threshold value K from the observed sizes by determining the average size in bits of the integers being encoded and using this average size as the value K.

One embodiment provides a system that decodes a sequence of integers that was encoded using a variable-length compression technique. The system first receives a sequence of integers to be decoded, wherein the sequence of integers was encoded using the threshold value K. For a given integer in the sequence to be decoded, the system scans an initial string of zeros for the given integer until a first one is encountered, counts the number of zeros encountered to produce a number L, and discards the first one. If L is equal to zero, the system uses N=K remaining bits to form a decoded integer. Otherwise, if L is greater than zero, the system prepends a one to the sequence of K+L−1 remaining bits to form the decoded integer of length N=K+L.

In a variation on this embodiment, the system retrieves all tags for the sequence of encoded integers from a first stream, and the system retrieves all remaining bits for the sequence of integers from a second stream, wherein the ordering of the tags in the first stream is the same as the ordering of the corresponding remaining bits in the second stream.

In a variation on this embodiment, the system scans the initial string of zeros by executing a first instruction. This first instruction scans a tag in the first stream until a first one is encountered and counts the number of zeros L in the tag, and generates a corresponding binary tag with the value L.

In a variation on this embodiment, the system uses the remaining N bits to form the decoded integer by executing a second instruction. This second instruction decodes integers from the second stream in parallel by first obtaining a binary tag value L from the sequence of binary tag values. Then, if L is equal to zero, the system extracts N=K remaining bits from the second stream. Otherwise if L is greater than zero, the system extracts K+L−1 remaining bits from the second stream, and prepends a one to the extracted remaining bits to form a sequence of N=K+L remaining bits. Then, the system prepends 32-N zeros to the sequence of N remaining bits to form the decoded integer.

TABLE 1 presents exemplary code for encoding and decoding a sequence of integers using the gamma(k) code.

TABLE 2 presents code for the GammaKStream class definition.

TABLE 3 presents code for the GammaKStream class implementation.

TABLE 4 presents code for the GammaKDecoder class definition.

TABLE 5 presents code for the GammaKDecoder class implementation.

DETAILED DESCRIPTION

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present disclosure is not intended to be limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Computing Environment

Figure 1:
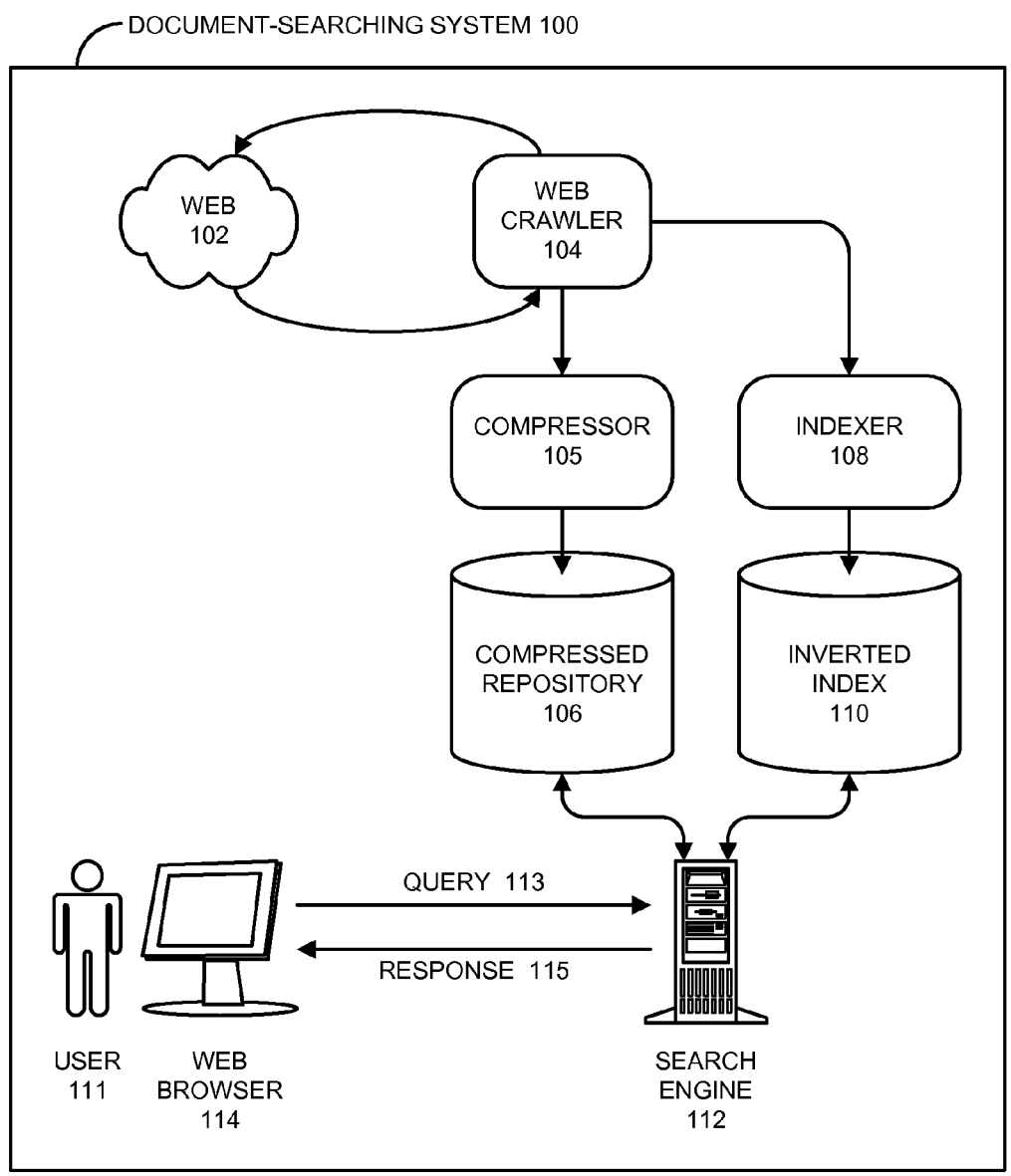
FIG. 1 illustrates an embodiment of a document-searching system.

FIG. 1 illustrates a document-searching system 100 in accordance with some embodiments. Document-searching system 100 includes a web 102, web crawler 104, compressor 105, compressed repository 106, indexer 108, inverted index 110, search engine 112, web browser 114, user 111, query 113, and response 115.

Web 102 can include any type of wired or wireless communication channel capable of coupling together a number of computing nodes. This includes, but is not limited to, the Internet.

Web crawler 104 can include a program or an automated script which navigates through and catalogues the web pages available via web 102 in an automated and systematic manner to provide fast web searches by storing and/or indexing the visited web pages. Web crawler 104 continually retrieves new documents from web 102. These new documents feed through a compressor 105, which compresses the new documents before they are stored in compressed repository 106. The new documents also feed through indexer 108, which adds terms from the new documents into inverted index 110. The inverted index 110 illustrated in FIG. 1 can be used to efficiently identify specific terms in documents.

Search engine 112 can include any node on a network including computational capability and including a mechanism for communicating across web 102. Search engine 112 operates in concert with one or more of web crawler 104, compressor 105, compressed repository 106, indexer 108 and inverted index 110. Search engine 112 is configured to receive a query 113 from user 111 through web browser 114. This query is used to search through compressed repository 106 and inverted index 110 to generate a number of references to relevant search results. Search engine 112 is also configured to transmit a response 115 to web browser 114 which includes the search results for query 113.

Web browser 114 can include any node on a network including computational capability and including a mechanism for communicating across web 102. Web browser 114 is configured to send a query 113 to search engine 112, and to receive a response 115 from search engine 112.

User 111 can include an individual, a group of individuals, an organization, a group of organizations, a computing system, a group of computing systems, or any other entity that can interact with web browser 114. User 111 interacts with web browser 114 to submit a query 113 to search engine 112 and to view response 115 which lists a number of web sites which are indexed by query 113.

Note that different embodiments may use different configurations, and are not limited to the configurations illustrated in document-searching system 100.

Gamma(k) Encoder/Decoder

Figure 2:
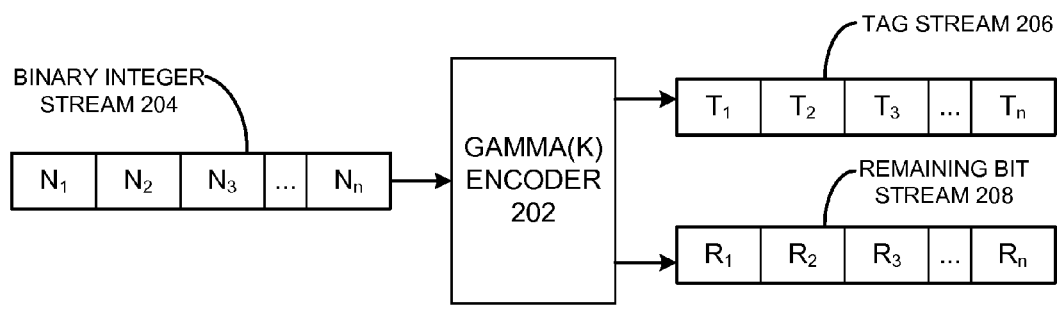
FIG. 2 illustrates an embodiment of a gamma(k) encoder.

FIG. 2 illustrates gamma(k) encoder 202 in accordance with an embodiment of the system. Gamma(k) encoder 202 constructs a code which is similar to the gamma code. (Note that unlike the gamma code, the first one in the gamma(k) code is a part of the tag and is removed before reading the remaining bits.) Gamma(k) encoder 202 receives binary integer stream 204 as input, and produces tag stream 206 and remaining bit stream 208 as output, wherein the ordering of the tags in tag stream 206 is the same as the ordering of the corresponding remaining bit strings in remaining bit stream 208. Binary integer stream 204 is a sequence of non-negative integers which are to be encoded.

During operation, gamma(k) encoder 202 generates a tag for a respective integer from binary integer stream 204 and generates a set of remaining bits which make up the integer. The tag is a unary number that specifies the number of bits in the following remaining bits portion of the encoded integer.

Figure 3:
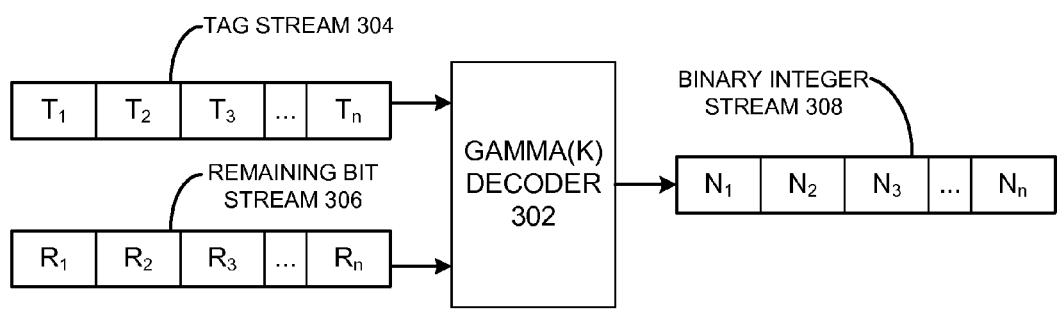
FIG. 3 illustrates an embodiment of a gamma(k) decoder.

FIG. 3 illustrates a gamma(k) decoder 302 in accordance with an embodiment of the system. Gamma(k) decoder 302 receives a tag stream 304 and a remaining bit stream 306 as input, and produces a binary integer stream 308 as output. For a respective tag from tag stream 304, gamma(k) decoder 302 decodes the tag to define the length of the corresponding bit string from remaining bit stream 306, and generates a corresponding decoded integer using the identified bit string from remaining bit stream 306.

Gamma(k) Code

Figure 4:
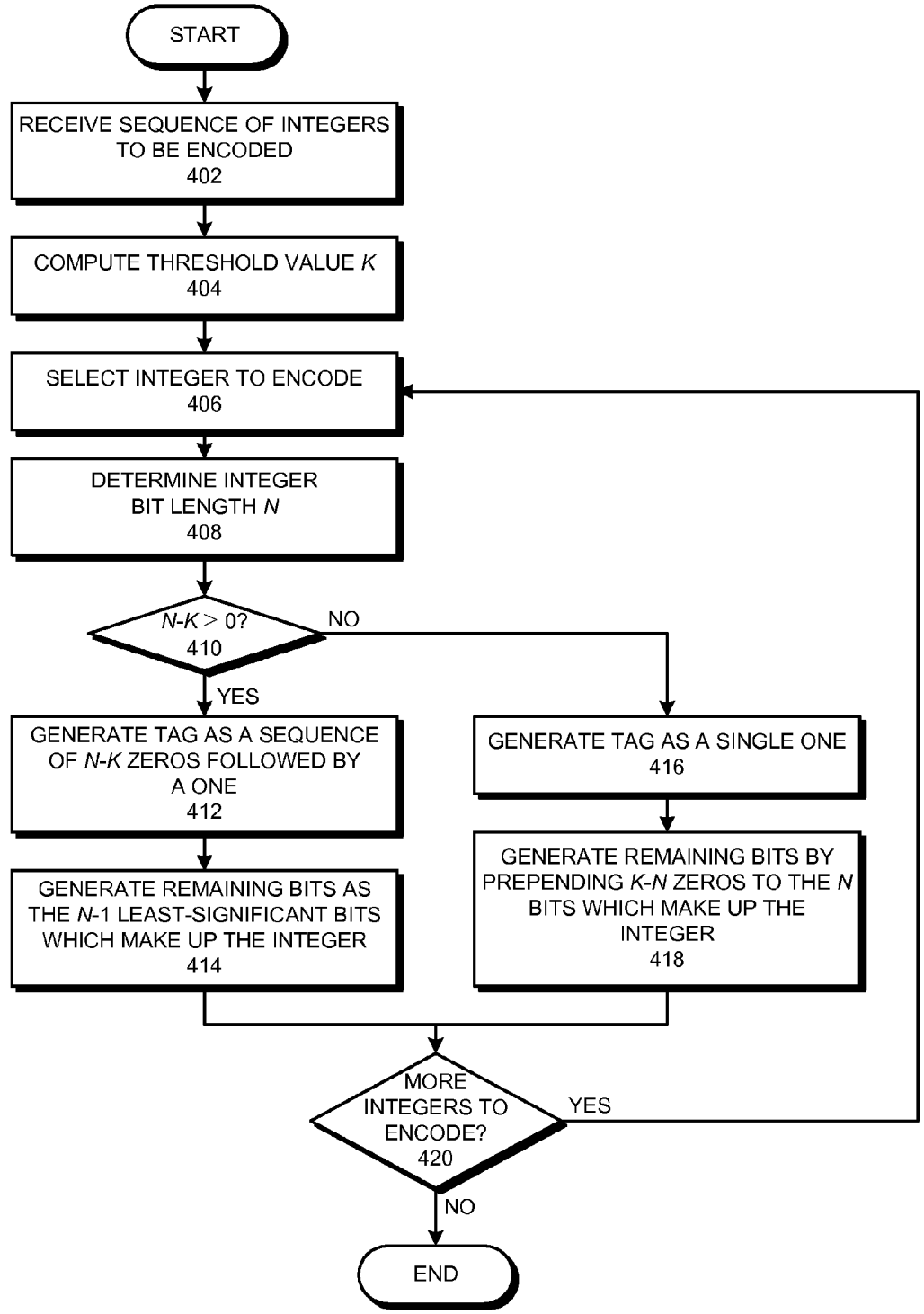
FIG. 4 presents a flowchart illustrating the steps involved in encoding a sequence of integers.

FIG. 4 presents a flowchart illustrating the steps involved in encoding a sequence of integers in accordance with an embodiment of the system. The gamma(k) code is a variant of a gamma code which can achieve a higher level of compression than a conventional gamma code. To construct a gamma (k) code, the system first receives a sequence of integers to be encoded (operation 402), and makes a pass through the sequence of integers to determine the distribution of the lengths of the integers. The system then computes a threshold value K (operation 404), which for example can be the average size or the median size (in bits) of the integers being encoded.

Next, the system constructs a code which is similar to the gamma code. However, instead of prepending a string of N zeros followed by a one to the remaining binary number, the system prepends a string of L=N−K zeros followed by a one to the remaining binary number. In doing so, the system selects an integer to encode (operation 406), and determines the integer bit length N for the selected integer (operation 408). The system then determines if the number to be encoded is greater than K (N−K>0) (operation 410). If so, the system generates a tag as a sequence of N−K zeros followed by a one (operation 412), and generates the set of remaining bits as a sequence of the N−1 least-significant bits which make up the integer (operation 414). On the other hand, if the number to be encoded is less than or equal to K bits in length (N−K≦0), the system generates a tag as a single one bit (operation 416), and generates the remaining bits by prepending K−N zeros to the N bits which make up the integer so that the string of remaining bits is exactly K bits in length (operation 418). Note that padding the remaining binary number in this way eliminates the need to prepend a negative number to the remaining binary number in the case where the size of the given number is less than K. (Note that it is impossible to represent a negative number with a standard unary encoding.) If there exist more integers to encode (operation 420), the system returns to operation 406 to select another integer to encode.

In one embodiment, the system stores all tags generated for the sequence of integers in a first stream, and stores all remaining bits generated for the sequence of integers in a corresponding second stream, wherein the ordering of the tags in the first stream is the same as the ordering of the corresponding remaining bits in the second stream. In another embodiment, the system combines the tags and the remaining bits generated for the sequence of integers into a single data stream, wherein a tag generated for a given integer is prepended to the corresponding remaining bits for the given integer.

Figure 5:
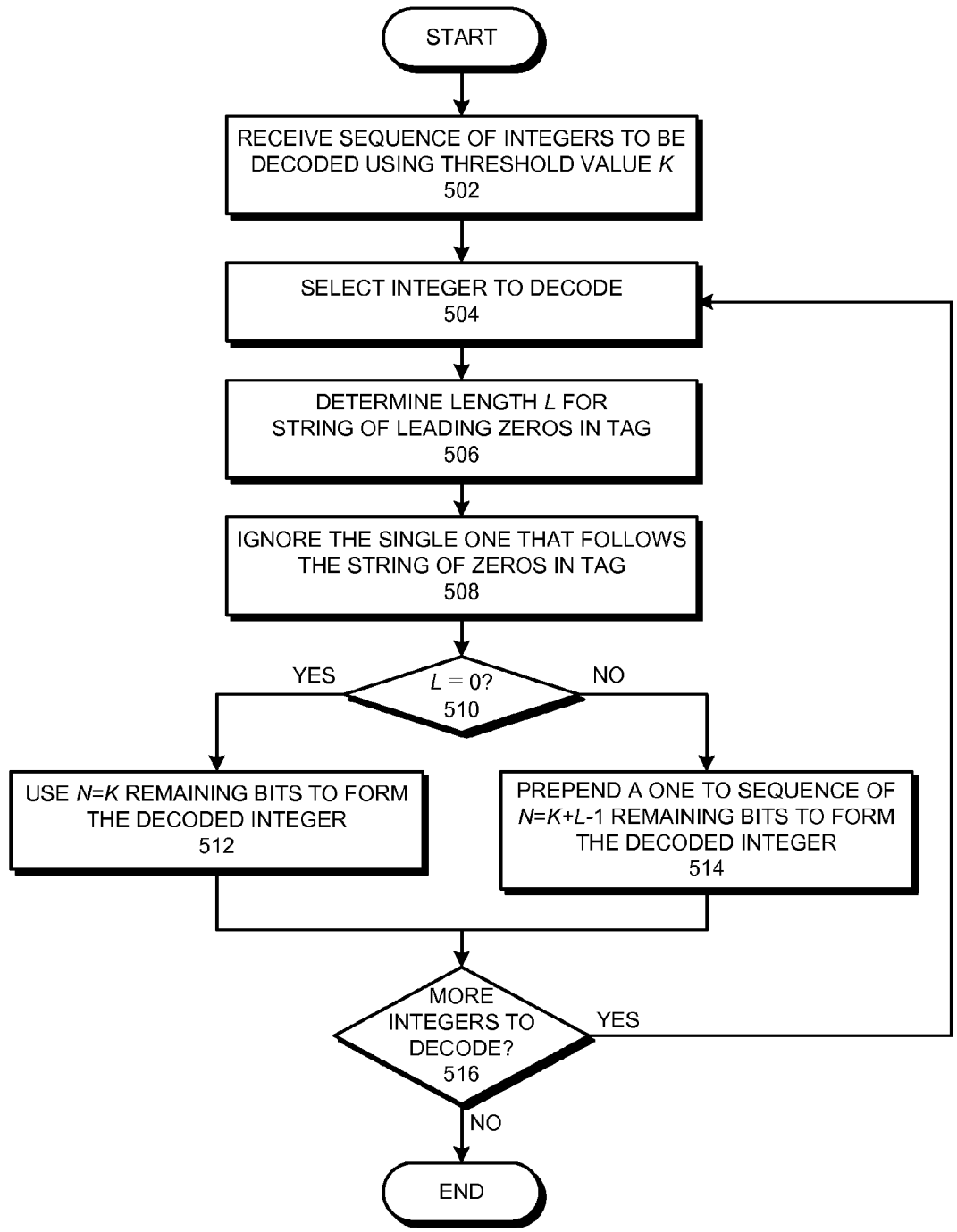
FIG. 5 presents a flowchart illustrating the steps involved in decoding a sequence of integers.

FIG. 5 presents a flowchart illustrating the steps involved in decoding a sequence of integers in accordance with an embodiment of the system. The gamma(k) decoding process operates in the reverse order as the gamma(k) encoding process. The system first receives a sequence of integers to be decoded and a threshold value K (operation 502). The system begins by selecting an integer to decode (operation 504), determining the integer bit length L for the string of leading zeros of the selected integer (operation 506), and ignoring the single one that follows the string of zeros (operation 508). Then, the system determines if L is equal to zero (operation 510). If so, the system uses N=K remaining bits to form a decoded integer (operation 512). Otherwise, if L is greater than zero, the system prepends a one to the sequence of K+L−1 remaining bits to form the decoded integer of length N=K+L (operation 514). Next, the system determines if there exist more integers to decode (operation 516). If so, the system returns to operation 504 to select another integer to decode.

In one embodiment, the system retrieves all tags for the sequence of encoded integers from a first stream, and the system retrieves all remaining bits for the sequence of integers from a second stream, wherein the ordering of the tags in the first stream is the same as the ordering of the corresponding remaining bits in the second stream.

Facilitating Parallel Processing During the Decoding Process

One embodiment facilitates parallel processing during the decoding process. As in the system described in U.S. patent application Ser. No. 10/917,739 (which is hereby incorporated by reference), one embodiment separates the unary encoded portion of each encoded integer (referred to as the "tag") from the remaining portion of each encoded integer (referred to as the "remaining bits"). The tags and remaining bits are then communicated in separate data streams.

These two data streams can then be processed in parallel. For example, suppose each integer is limited to 32 bits in length. In this case, a 128-bit wide circuit can be used to decode four integers in parallel. More specifically, in one embodiment, a parallel Bit Scan Forward (BSF) circuit can be used to decode the lengths of four consecutive integers in parallel from the stream of tags. The determined lengths can then be used to parse the remaining bits of the four consecutive integers from the stream of remaining bits.

Code Listing

Exemplary code for encoding and decoding a sequence of integers using the gamma(k) code appears below.

TABLE 1

```
// Example usage of the gamma(k) stream encoding and decoding:
//
//  /* Encode the values */
//  GammaKStream enc(k);
//  enc.Put(1);
//  enc.Put(2134);
//  enc.Put(434);
//
//  /* Decode the buffer */
//  GammaKDecoder dec(&enc);
//  uint32 value[0] = dec.Get( ); /* returns 1 */
//  uint32 value[1] = dec.Get( ); /* returns 2134 */
//  uint32 value[2] = dec.Get( ); /* returns 434  */
```

TABLE 2

```
/*---------------------------*/
/*       GammaKStream        */
/*---------------------------*/
class GammaKStream {
 public:
  // A constructor that will encode numbers into an internal
buffer and grow
  // the buffer as needed. The buffer and length can be retrieved
via the
  // "base( )" and "length( )" accessors.
  GammaKStream(int k);
  // Encode the value "val".
  void Put(uint32 val);
  // Returns a pointer to the base of the encoded data.
  const char* base( ) const { return buf_.base( ); }
  // Returns a pointer to the unary encoded tags
  const char* tags( ) const { return tags_.base( ); }
  // Returns the length of the encoded data in bytes.
  int length( ) const { return (buf_.Bits( ) + 7)/8; }
  // Returns the length of the tags in bytes.
  int taglength( ) const { return (tags_.Bits( ) + 7)/8; }
  // Number of values encoded so far
  int num_encoded( ) { return num_encoded_; }
  // The length of a value in bits (say n) is stored as n-k in
unary.
  int k( ) { return k_; }
  void Flush( ) {
    buf_.Flush(0);
    tags_.Flush(1);
  }
 private:
  int         k_;
  int         num_encoded_;   // number of values encoded so far
  BitEncoder  buf_;
  BitEncoder  tags_;
};
```

TABLE 3

```
GammaKStream::GammaKStream(int k)
    : k_(k),
      num_encoded_(0) {
}
void GammakStream::Put(uint32 val) {
  int len = BitsRequired(val);
  int extra_len;
  if (len < k_) {
    extra_len = 1;
    len = k_;
  } else {
    extra_len = len - k_ + 1;
  }
  tags_.PutUnary(extra_len);
  uint32 msbit = (len > k_);   //Is the Most sig bit implicitly 1?
  buf_.PutBits(val, len - msbit);
  ++num_encoded_;
}
```

TABLE 4

```
/*---------------------------*/
/*       GammaKDecoder        */
/*---------------------------*/
class GammaKDecoder {
 public:
  // Take in a pointer to the start of the encoded stream
  GammaKDecoder(GammaKStream *s);
  // Gets the next value
  uint32 Get( );
 private:
  BitDecoder   data_;
  BitDecoder   tags_;
  int          k_;
};
```

TABLE 5

```
GammaKDecoder::GammaKDecoder(GammaKStream *s)
    : data_(s->base( ), s->length( )),
      tags_(s->tags( ), s->taglength( )),
      k_(s->k( )) {
}
inline uint32 GammakDecoder::Get( ) {
  uint32 bits = 0;
  tags_.GetUnary(&bits);
  bits += (k_ - 1);
  uint32 val = 0;
  uint32 msbit = (bits > k_);
  uint32 val = 0;
  data_.GetBits(bits - msbit, &val);
  val |= (msbit << (bits - 1));
  return val;
}
```

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for compressing a sequence of integers, comprising:
   scanning through the sequence of integers and observing the sizes of the integers;
   determining a threshold value K from the observed sizes; and
   for a given integer which is N bits in length,
      if N−K is greater than zero,
         generating a tag for the encoded integer as a sequence of N−K zeros followed by a one, and
         generating a set of remaining bits for the encoded integer as a sequence of the N−1 least-significant bits which make up the integer.

2. The method of claim 1, wherein if N−K is less than or equal to zero, for the given integer the method further comprises:
   generating a tag for the encoded integer as a single one, and
   generating a set of remaining bits for the encoded integer by padding the N bits which make up the integer with zeros so that the set of remaining bits is K bits in length.

3. The method of claim 1, further comprising for a given integer to be encoded, prepending the tag to the remaining bits to produce the encoded integer.

4. The method of claim 1, further comprising:
   storing all tags generated for the sequence of integers in a first stream; and
   storing all remaining bits generated for the sequence of integers in a corresponding second stream;
   wherein the ordering of the tags in the first stream is the same as the ordering of the corresponding remaining bits in the second stream.

5. The method of claim 1, further comprising:
   combining the tags and the remaining bits generated for the sequence of integers into a single data stream;
   wherein a tag generated for a given integer is prepended to the corresponding remaining bits for the given integer.

6. The method of claim 1, wherein determining the threshold value K from the observed sizes involves determining the average size in bits of the integers being encoded and using this average size as the value K.

7. A method for decoding a sequence of integers, comprising:
   receiving a sequence of integers to be decoded, wherein the sequence of integers was encoded using the threshold value K;
   for a given integer in the sequence to be decoded,
      scanning through an initial string of zeros for the given integer until a first one is encountered and counting the number of zeros encountered to produce a number L;
      discarding the first one; and
      if L is equal to zero, using N=K remaining bits to form a decoded integer;
      otherwise if L is greater than zero, prepending a one to the sequence of K+L−1 remaining bits to form the decoded integer of length N=K+L.

8. The method of claim 7, wherein all tags for the sequence of encoded integers are retrieved from a first stream, and wherein all remaining bits for the sequence of integers are retrieved from a second stream;
   wherein the ordering of the tags in the first stream is the same as the ordering of the corresponding remaining bits in the second stream.

9. A computer-readable storage medium storing instructions that when executed by a computer cause the computer to perform a method for compressing a sequence of integers, comprising:
   scanning through the sequence of integers and observing the sizes of the integers;
   determining a threshold value K from the observed sizes; and
   for a given integer which is N bits in length,
      if N−K is greater than zero,
         generating a tag for the encoded integer as a sequence of N−K zeros followed by a one, and
         generating a set of remaining bits for the encoded integer as a sequence of the N−1 least-significant bits which make up the integer.

10. The computer-readable storage medium of claim 9, wherein if N−K is less than or equal to zero, the method further comprises:
   generating a tag for the encoded integer as a single one, and
   generating a set of remaining bits for the encoded integer by padding the N bits which make up the integer with zeros so that the set of remaining bits is K bits in length.

11. The computer-readable storage medium of claim 9, further comprising for a given integer to be encoded, prepending the tag to the remaining bits to produce the encoded integer.

12. The computer-readable storage medium of claim 9, further comprising:
   storing all tags generated for the sequence of integers in a first stream; and
   storing all remaining bits generated for the sequence of integers in a corresponding second stream;
   wherein the ordering of the tags in the first stream is the same as the ordering of the corresponding remaining bits in the second stream.

13. The computer-readable storage medium of claim 9, further comprising:
   combining the tags and the remaining bits generated for the sequence of integers into a single data stream;
   wherein a tag generated for a given integer is prepended to the corresponding remaining bits for the given integer.

14. The computer-readable storage medium of claim 9, wherein determining the threshold value K from the observed sizes involves determining the average size in bits of the integers being encoded and using this average size as the value K.

15. A computer-readable storage medium storing instructions that when executed by a computer cause the computer to perform a method for decoding a sequence of integers, comprising:
   receiving a sequence of integers to be decoded, wherein the sequence of integers was encoded using the threshold value K;
   for a given integer in the sequence to be decoded,
      scanning through an initial string of zeros for the given integer until a first one is encountered and counting the number of zeros encountered to produce a number L;
      discarding the first one; and
      if L is equal to zero, using N=K remaining bits to form a decoded integer;
      otherwise, if L is greater than zero, prepending a one to the sequence of K+L−1 remaining bits to form the decoded integer of length N=K+L.

16. The computer-readable storage medium of claim 15, wherein all tags for the sequence of encoded integers are retrieved from a first stream, and wherein all remaining bits for the sequence of integers are retrieved from a second stream;
   wherein the ordering of the tags in the first stream is the same as the ordering of the corresponding remaining bits in the second stream.

17. An apparatus for encoding a sequence of integers, comprising:
   a scanning mechanism configured to:
      scan through the sequence of integers and observe the sizes of the integers, and
      determine a threshold value K from the observed sizes; and
   an encoding mechanism configured to encode a given integer which is N bits in length by:
      if N−K is greater than zero,
         generating a tag for the encoded integer as a sequence of N−K zeros followed by a one, and
         generating a set of remaining bits for the encoded integer as a sequence of the N−1 least-significant bits which make up the integer.

18. The apparatus of claim 17, wherein if N−K is less than or equal to zero, the encoding mechanism is configured to encode the given integer by:

generating a tag for the encoded integer as a single one; and generating a set of remaining bits for the encoded integer by padding the N bits which make up the integer with zeros so that the set of remaining bits is K bits in length.

19. The apparatus of claim 17, wherein for a given integer to be encoded, the encoding mechanism prepends the tag to the remaining bits to produce the encoded integer.

20. The apparatus of claim 17, wherein the encoding mechanism is further configured to:

store all tags generated for the sequence of integers in a first stream; and store all remaining bits generated for the sequence of integers in a corresponding second stream;

wherein the ordering of the tags in the first stream is the same as the ordering of the corresponding remaining bits in the second stream.

21. The apparatus of claim 17, wherein the configuration mechanism is further configured to:

combine the tags and the remaining bits generated for the sequence of integers into a single data stream;

wherein a tag generated for a given integer is prepended to the corresponding remaining bits for the given integer.

22. The apparatus of claim 17, wherein determining the threshold value K from the observed sizes involves determining the average size in bits of the integers being encoded and using this average size as the value K.

23. An apparatus for decoding a sequence of integers, comprising:

a receiving mechanism configured to receive a sequence of integers to be decoded, wherein the sequence of integers was encoded using the threshold value K; and a decoding mechanism, configured to decode a given integer by:

scanning through an initial string of zeros for the given integer until a first one is encountered and counting the number of zeros encountered to produce a number L;

discarding the first one; and if L is equal to zero, using N=K+L remaining bits to form a decoded integer;

otherwise if L is greater than zero, prepending a one to the sequence of K+L−1 remaining bits to form the decoded integer of length N=K+L.

24. The apparatus of claim 23, wherein the receiving mechanism is further configured to receive all tags for the sequence of encoded integers from a first stream, and receive all remaining bits for the sequence of integers from a second stream;

wherein the ordering of the tags in the first stream is the same as the ordering of the corresponding remaining bits in the second stream.

\* \* \* \* \*